United States Patent
Suwa et al.

(10) Patent No.: US 9,093,417 B2
(45) Date of Patent: Jul. 28, 2015

(54) HEAT RADIATING COMPONENT AND SEMICONDUCTOR PACKAGE HAVING THE SAME

(75) Inventors: Yoriyuki Suwa, Nagano (JP); Kenji Kawamura, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 13/419,926

(22) Filed: Mar. 14, 2012

(65) Prior Publication Data

US 2012/0235292 A1 Sep. 20, 2012

(30) Foreign Application Priority Data

Mar. 18, 2011 (JP) .................... 2011-061604

(51) Int. Cl.
*H01L 23/34* (2006.01)
*H01L 23/373* (2006.01)
*H01L 23/367* (2006.01)

(52) U.S. Cl.
CPC ........ *H01L 23/3736* (2013.01); *H01L 23/3675* (2013.01); *H01L 2924/0002* (2013.01)

(58) Field of Classification Search
USPC .......... 257/720; 165/80.3, 133, 185; 361/705, 361/702
See application file for complete search history.

(56) References Cited

U.S. PATENT DOCUMENTS

| | | | |
|---|---|---|---|
| 5,300,809 A * | 4/1994 | Nakamura et al. | 257/684 |
| 5,596,231 A * | 1/1997 | Combs | 257/776 |
| 5,608,267 A * | 3/1997 | Mahulikar et al. | 257/796 |
| 5,629,835 A * | 5/1997 | Mahulikar et al. | 361/719 |
| 6,252,776 B1 * | 6/2001 | Saito et al. | 361/719 |
| 6,469,380 B2 * | 10/2002 | Sorimachi et al. | 257/706 |
| 7,049,532 B2 | 5/2006 | Kanazawa et al. | |
| 2005/0255646 A1 * | 11/2005 | Cheng et al. | 438/214 |
| 2006/0102373 A1 | 5/2006 | Kamitake et al. | |
| 2010/0065246 A1 * | 3/2010 | Gupta et al. | 165/80.2 |
| 2011/0123821 A1 * | 5/2011 | Hirotsuru et al. | 428/596 |

FOREIGN PATENT DOCUMENTS

| | | |
|---|---|---|
| JP | 6-302730 | 10/1994 |
| JP | H06-302730 | 10/1994 |
| JP | H06-309946 | 11/1994 |
| JP | 10-074872 | 3/1998 |
| JP | H10-227527 | 8/1998 |
| JP | 2000-313996 | 11/2000 |
| JP | 2001-291806 | 10/2001 |
| JP | 2004-104074 | 4/2004 |
| JP | 2005-71727 | 3/2005 |

OTHER PUBLICATIONS

Japanese Office Action with English Translation dated Feb. 3, 2015, 8 pages.

\* cited by examiner

*Primary Examiner* — Cheung Lee
*Assistant Examiner* — Frederick B Hargrove
(74) *Attorney, Agent, or Firm* — Rankin, Hill & Clark LLP

(57) ABSTRACT

In one embodiment, there is provided a heat radiating component. The heat radiating component includes: a base material made mainly of copper; an electroplated aluminum layer that covers at least a part of a surface of the base material; and an alumite layer formed on the electroplated aluminum layer and formed by anodic-oxidizing the electroplated aluminum layer.

13 Claims, 5 Drawing Sheets

BEFORE PLANARIZATION
TREATMENT (1000 TIMES)

AFTER PLANARIZATION
TREATMENT (1000 TIMES)

WITHOUT PLANARIZATION
TREATMENT (1500 TIMES)

WITH PLANARIZATION
TREATMENT (500 TIMES)

WITH PLANARIZATION
TREATMENT (1500 TIMES)

HEAT RADIATING COMPONENT AND SEMICONDUCTOR PACKAGE HAVING THE SAME

This application claims priority from Japanese Patent Application No. 2011-061604, filed on Mar. 18, 2011, the entire contents of which are herein incorporated by reference.

BACKGROUND

1. Technical Field

Embodiments described herein relate to a heat radiating component and a semiconductor package having the same.

2. Description of Related Art

Since a semiconductor device used for a central processing unit (CPU) and the like becomes hot while in operation, it is extremely important to swiftly radiate the heat to the outside to exhibit the performance of the semiconductor device.

Therefore, hitherto, passages for effectively radiating the heat emitted by the semiconductor device outside have been secured by loading heat radiating components, such as heat spreaders or heat pipes, on the semiconductor device. In addition, studies have been carried out to improve the heat radiating properties of the heat radiating components, such as heat spreaders or heat pipes, and, particularly, a variety of techniques have been disclosed regarding surface treatments of heat spreaders, heat pipes, and the like.

For example, a heat sink is disclosed for which an aluminum alloy die cast heat sink is used as a base, grooves are formed in a heat radiating direction, and the entire surface is blackened by painting or a plating treatment (for example, see JP-A-2001-291806).

In addition, a heat spreader is disclosed for which an insulating layer is formed of a fluororesin on the surface of a copper or copper-dominant alloy sheet so that the functions of insulating properties, heat resistance, thermal fatigue resistance, solvent resistance, and the like are secured, and, furthermore, the fluororesin film is made into a blackish color (for example, see JP-A-10-74872).

In addition, a heat radiating sheet is disclosed which is blackened by carrying out an alumite treatment on the surface of a material of a highly thermal conductive metal sheet covered with aluminum (cladding material) (for example, see JP-A-06-302730).

As such, the related art proposes use of blackening of the surface of a heat radiating component to improve the heat radiating properties. However, blackening of the surface of a heat radiating component is not sufficient. For example, the surface of an aluminum alloy heat sink is blackened in JP-A-2001-291806, but aluminum alloy has a lower thermal conductivity than copper, and therefore blackening of the surface thereof cannot lead to sufficient thermal conductivity.

In addition, the surface of a copper or copper-dominant alloy sheet is coated with a fluororesin in JP-A-10-74872, but the fluororesin has a high emissivity of 0.8 or more but has a poor thermal conductivity of 0.1 W/mK to 0.25 W/mK, and therefore heat cannot be efficiently radiated, and sufficient heat radiating properties cannot be obtained.

In addition, a cladding material having aluminum attached to copper is used in JP-A-06-302730, but there are problems in that the cladding material is expensive, and a boundary present between the copper and the aluminum hinders favorable thermal conduction from the copper to the aluminum.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

According to one or more illustrative aspects of the present invention, there is provided a heat radiating component. The heat radiating component includes: a base material made mainly of copper; an electroplated aluminum layer that covers at least a part of a surface of the base material; and an alumite layer formed on the electroplated aluminum layer and formed by anodic-oxidizing the electroplated aluminum layer.

Other aspects and advantages of the present invention will be apparent from the following description, the drawings and the claims.

DETAILED DESCRIPTION OF EXEMPLARY EMBODIMENTS

Figure 1:
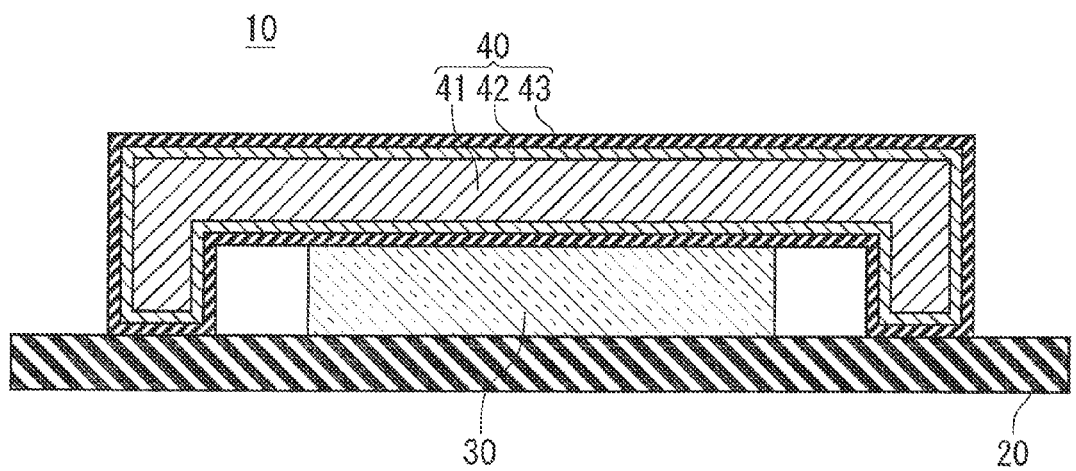
FIG. 1 is a cross-sectional view exemplifying a semiconductor package on which the heat radiating component according to the first embodiment is mounted.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

First Embodiment

FIG. 1 is a cross-sectional view exemplifying a semiconductor package on which the heat radiating component according to the first embodiment is mounted. In FIG. 1, a semiconductor package 10 has a semiconductor device 30 mounted on a substrate 20, and has a heat radiating component 40 according to the first embodiment mounted on the semiconductor device 30.

The substrate 20 is, for example, an FR-4 substrate (a copper-clad laminate having an epoxy resin impregnated in a frame-retardant glass fabric base material). An electrode pad (not shown) is formed on the surface of the substrate 20 on the semiconductor device 30 side. Meanwhile, a variety of wiring substrates including a coreless or cored multilayer wiring substrate manufactured by the build-up method, a penetrating multilayer wiring substrate in which the respective wiring layers are connected using a through-via, an IVH multilayer wiring substrate in which specific wiring layers are connected using interstitial via holes (IVH), and the like may be used as the substrate 20.

The semiconductor device 30 is a semiconductor integrated circuit (not shown) formed on a semiconductor substrate made of, for example, silicon (Si), germanium (Ge), or the like. An electrode pad (not shown) is formed on the surface of the semiconductor device 30 on the substrate 20 side. The electrode pad on the substrate 20 and the electrode pad on the semiconductor device 30 are electrically connected with each other through, for example, a solder bump (not shown) or the like. The semiconductor device 30 is used in, for example, a CPU or the like, and becomes hot while in operation.

Meanwhile, a heat conductive member, such as indium, may be disposed at a portion where the semiconductor device 30 and the heat radiating component 40 come into contact with each other. In this case, heat emitted by the semiconductor device 30 mounted on the substrate 20 is transferred to the heat radiating component 40 through the heat conductive member disposed on the semiconductor device 30. As such, the heat conductive member may be used as means for thermally connecting the semiconductor device 30 and the heat radiating component 40 without direct contact thereof.

The heat radiating component 40 has a base material 41, an electroplated aluminum layer 42, and an alumite layer 43, and is fixed on the substrate 20 using, for example, an adhesive (not shown) or the like. The heat radiating component 40 is in contact with the semiconductor device 30, and functions as a so-called heat spreader. The planar shape of the heat radiating component 40 is, for example, rectangular, and can be made into a size of, for example, approximately 30 mm length×30 mm width to 50 mm length×50 mm width. The thickness of the heat radiating component 40 can be, for example, approximately 1 mm to 3 mm.

The base material 41 is formed of a material having a higher thermal conductivity than aluminum (Al). Examples of the material for the base material 41 include materials containing copper (Cu) as the main component, such as copper (Cu) and copper alloys. Meanwhile, the thermal conductivity of copper (Cu) is approximately 390 W/mK, and the thermal conductivity of aluminum (Al) is approximately 247 W/mK.

The electroplated aluminum layer 42 is formed so as to cover the entire surface of the base material 41. The electroplated aluminum layer 42 is a layer formed by the electric aluminum plating method. The thickness of the electroplated aluminum layer 42 can be, for example, approximately 20 μm. The thickness of the electroplated aluminum layer 42 can be controlled by the quantity of electricity.

In the electric aluminum plating method, an aqueous solution cannot be used, and an organic solvent-based plating bath, a high-temperature fused salt bath, and the like can be used. The organic solvent-based plating bath includes baths having $AlCl_3$ and $LiAlH_4$ or LiH dissolved in ether, baths having the same dissolved in tetrahydrofuran, toluene solutions of $NaF.2Al(C_2H_5)_3$, and the like. In addition, mixed fused salt baths of an aluminum halogenide and an alkyl pyridinium halogenide, and the like can be used as the high-temperature fused salt bath.

In addition, as disclosed in, for example, JP-A-2008-195990, electric aluminum plating baths or the like which are obtained by mixing and fusing one or two or more compounds selected from a group consisting of aluminum halogenides, N-alkyl pyridinium halides, N-alkyl imidazolium halides, N,N'-alkyl imidazolium halides, N-alkyl pyrazolium halides, and N,N'-alkyl pyrazolium halides; NaCl; and KCl may also be used. Meanwhile, the electric aluminum plating method is superior to the hot-dip plating method and the like in terms of the controllability of the plate thickness.

The alumite layer 43 is formed so as to cover the entire surface of the electroplated aluminum layer 42. The alumite layer 43 is a porous metallic oxide layer formed by the anodic oxidation method (an aluminum oxide layer having small-diameter pores regularly formed therein). The alumite layer 43 has a blackish pigment infiltrated in the small-diameter pores, and the hue of the alumite layer 43 is blackish. The thickness of the alumite layer 43 can be, for example, approximately 10 μm. The thickness of the alumite layer 43 can be controlled by the quantity of electricity. Meanwhile, the emissivity of blackish alumite is approximately 0.9 to 0.95, which is a significantly large value compared with the emissivity of copper (0.03 to 0.06) or the emissivity of aluminum (0.05 to 0.25).

In order to form the alumite layer 43 by the anodic oxidation method, for example, the surface of the electroplated aluminum layer 42 is washed, then, immersed in an electrolytic solution (preferably a sulfuric acid aqueous solution), the immersed electroplated aluminum layer 42 is used as a cathode, a platinum (Pt) electrode disposed opposite to the electroplated aluminum layer is used as an anode, and electric currents are made to flow (by applying a pulse voltage). Thereby, a part of the surface of the electroplated aluminum layer 42 is oxidized, and the alumite layer 43 can be formed.

As such, according to the first embodiment, the base material 41 is formed of a metallic material having a higher thermal conductivity than aluminum (Al) (for example, a material containing copper (Cu) as the main component, such as copper (Cu) or copper alloys), thereby realizing excellent heat transferring properties. In addition, at least a part of the surface of the base material 41 is covered with the electroplated aluminum layer 42, and the blackish alumite layer 43 having a significantly large emissivity compared with copper or aluminum is formed on the surface of the electroplated aluminum layer 42, thereby realizing excellent heat radiating properties.

Modified Example 1 of the First Embodiment

Modified Example 1 of the first embodiment shows an example of a heat radiating component that is different from the first embodiment. Meanwhile, in Modified Example 1 of the first embodiment, similar components of the embodiment which have already been described will not be described.

Figure 2:
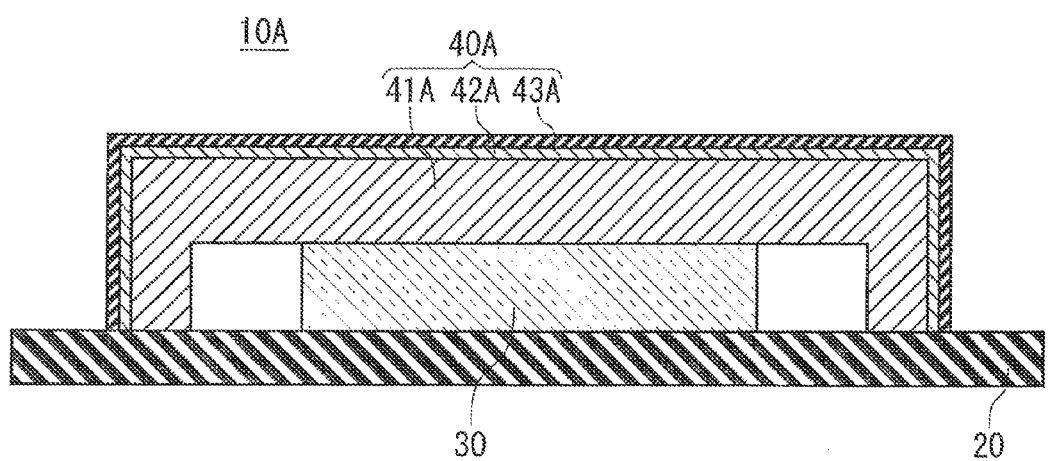
FIG. 2 is a cross-sectional view exemplifying a semiconductor package on which the heat radiating component according to Modified Example 1 of the first embodiment is mounted.

FIG. 2 is a cross-sectional view exemplifying a semiconductor package on which the heat radiating component according to Modified Example 1 of the first embodiment is mounted. In FIG. 2, a semiconductor package 10A is different from the semiconductor package 10 (refer to FIG. 1) so that the heat radiating component 40 is substituted with a heat radiating component 40A.

The heat radiating component 40A has the base material 41, an electroplated aluminum layer 42A, and an alumite layer 43A, and is fixed on the substrate 20 using, for example, an adhesive (not shown) or the like. The heat radiating component 40A is in contact with the semiconductor device 30, and functions as a so-called heat spreader. The planar shape of the heat radiating component 40A is, for example, rectangular, and can be made into a size of, for example, approximately 30 mm length×30 mm width to 50 mm length×50 mm width. The thickness of the heat radiating component 40A can be, for example, approximately 1 mm to 3 mm.

The electroplated aluminum layer 42A and the alumite layer 43A are formed so as to cover only the top surface and the outer side surfaces of the base material 41 instead of being formed so as to cover the entire surface of the base material 41. As a result, the semiconductor device 30 is in contact with the base material 41 without passing the electroplated aluminum layer 42A and the alumite layer 43A.

As such, the electroplated aluminum layer and the alumite layer may not necessarily be formed so as to fully cover the entire surface of the base material 41, and may not be formed on, for example, the portion in which the base material 41 comes into contact with the semiconductor device 30. Thereby, heat emitted by the semiconductor device 30 is directly transferred to the base material 41 without passing the electroplated aluminum layer 42A and the alumite layer 43A, and therefore the heat transferring properties can be further improved.

Meanwhile, a heat conductive member, such as indium, may be disposed at a portion in which the semiconductor device 30 and the base material 41 are in contact with each other. In this case, heat emitted by the semiconductor device 30 mounted on the substrate 20 is transferred to the base material 41 through the heat conductive member disposed on the semiconductor device 30. As such, the heat conductive member may be used as means for thermally connecting the semiconductor device 30 and the base material 41 without direct contact thereof.

According to Modified Example 1 of the first embodiment, heat emitted by the semiconductor device 30 is transferred to the base material 41 without passing the electroplated aluminum layer 42A and the alumite layer 43A, and therefore the heat transferring properties of the heat radiating component 40A can be further improved.

Modified Example 2 of the First Embodiment

Modified Example 2 of the first embodiment shows an example in which a planarization treatment is carried out on the electroplated aluminum layer 42. Meanwhile, in Modified Example 2 of the first embodiment, similar components of the embodiment which have already been described will not be described.

In the first embodiment, after the electroplated aluminum layer 42 is formed on the surface of the base material 41 by the electric aluminum plating method, the alumite layer 43 is formed on the surface of the electroplated aluminum layer 42 by the anodic oxidation method. However, according to the inventors' studies, it was confirmed that, when a planarization treatment is carried out on the surface of the electroplated aluminum layer 42 through polishing, a blasting treatment, or the like before forming the alumite layer 43, the heat radiating properties can be further improved.

Figure 3A:
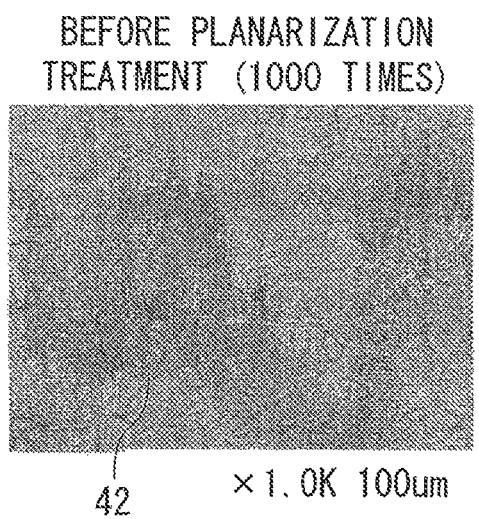
FIGS. 3A and 3B show examples of the SEM photograph of the surface of an electroplated aluminum layer.
Figure 3B:
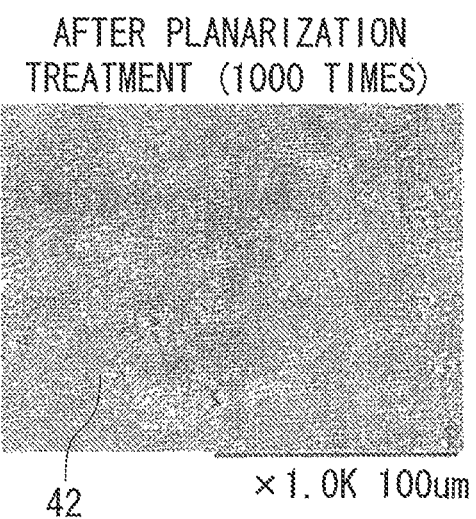
Figure 4A:
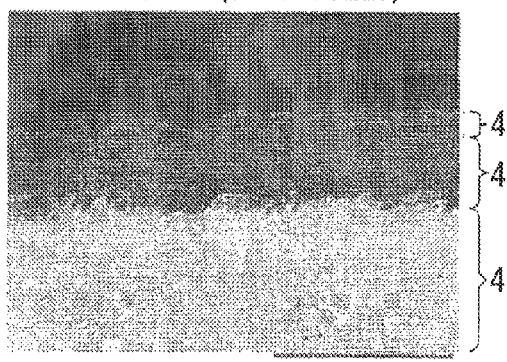
FIGS. 4A to 4C show examples of the SEM photograph of the cross sections of an electroplated aluminum layer and an alumite layer.
Figure 4B:
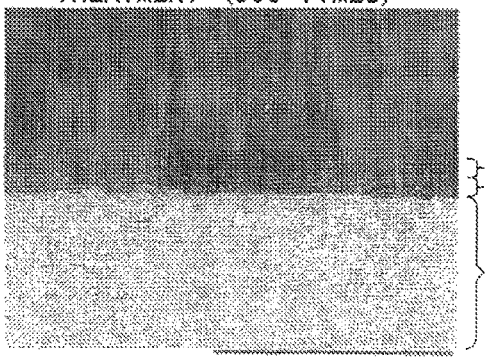
Figure 4C:
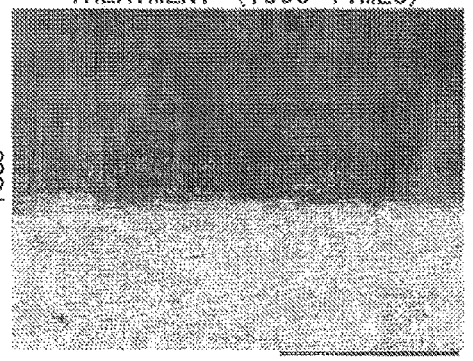

FIGS. 3A and 3B show examples of the SEM photograph of the surface of the electroplated aluminum layer. FIGS. 3A and 3B show the surface of the electroplated aluminum layer 42 before and after the planarization treatment respectively (with a magnification of 1000 times). FIGS. 4A to 4C show examples of the SEM photograph of the cross sections of the electroplated aluminum layer and the alumite layer. FIG. 4A shows the cross section in a case that the alumite layer 43 is formed on the electroplated aluminum layer 42 for which the planarization treatment is not carried out (with a magnification of 1500 times), FIG. 4B shows the cross section in a case that the alumite layer 43 is formed on the electroplated aluminum layer 42 for which the planarization treatment is carried out (with a magnification of 500 times), and FIG. 4C shows the cross section in a case that the alumite layer 43 is formed on the electroplated aluminum layer 42 for which the planarization treatment is carried out (with a magnification of 1500 times). Meanwhile, only the magnification differs in FIGS. 4B and 4C.

As shown in FIGS. 3 and 4, when the alumite layer 43 is formed on the electroplated aluminum layer 42 for which the planarization treatment is carried out, the alumite layer 43 uniformly grows, and it is possible to form the alumite layer 43 having a planar surface and a uniform thickness. Since small-diameter pores are more regularly formed in the alumite layer 43 which is formed in the above manner, the hue of the alumite layer having a blackish pigment infiltrated in the small-diameter pores becomes darker than a case in which the alumite layer 43 is formed on the electroplated aluminum layer 42 for which the planarization treatment is not carried out. As a result, the emissivity is further improved, and therefore the heat radiating properties are considered to be improved. Specific effects (improvement in the heat radiating properties) will be described below (refer to FIG. 5 and Table 1).

Meanwhile, the arithmetic mean roughness Ra of the electroplated aluminum layer 42 for which the planarization treatment was not carried out, as shown in FIG. 4A, was approximately 1 μm to 2 μm, and the arithmetic mean roughness Ra of the alumite layer 43 formed on the surface of the electroplated aluminum layer 42 for which the planarization treatment was not carried out was approximately 1 μm to 2 μm. In addition, the arithmetic mean roughness Ra of the electroplated aluminum layer 42 for which the planarization treatment was carried out, as shown in FIGS. 4B and 4C, was approximately 0.5 μm, and the arithmetic mean roughness Ra of the alumite layer 43 formed on the surface of the electroplated aluminum layer 42 for which the planarization treatment was carried out was approximately 0.5 μm. According to the inventors' studies, the optimal arithmetic mean roughness of the alumite layer 43 is considered to be 1 μm or less. Here, the arithmetic mean roughness Ra was measured using a surface roughness measuring apparatus (SURFCOM E-MD-S75A, manufactured by Tokyo Seimitsu Co., Ltd.) based on JIS B0633:2001 (the arithmetic mean roughness Ra as shown below was measured in the same manner).

As such, according to Modified Example 2 of the first embodiment, when a planarization treatment is carried out on the surface of the electroplated aluminum layer 42 through polishing, a blasting treatment, or the like, and then the alumite layer 43 is formed on the surface of the electroplated aluminum layer 42 for which the planarization treatment is carried out by the anodic oxidation method, it is possible to form the alumite layer 43 having a planar surface and a uniform thickness. As a result, the hue of the alumite layer having a blackish pigment infiltrated in the small-diameter pores becomes darker than a case in which the alumite layer 43 is formed on the electroplated aluminum layer 42 for which the planarization treatment is not carried out as the first embodiment, and therefore the heat radiating properties can be improved.

[Evaluation of Heat Radiating Properties]

For a heat radiating component manufactured by the manufacturing method according to the first embodiment (the heat radiating component 10A), a heat radiating component manufactured by the manufacturing method according to Modified Example 2 of the first embodiment (the heat radiating component 10B), heat radiating components X, Y, and Z according to the comparative examples, the heat radiating properties were evaluated.

Initially, the heat radiating component 10A was manufactured by the manufacturing method according to the first embodiment. Specifically, firstly, a base material 41 made of copper (Cu) was prepared, and an approximately 20 μm-thick electroplated aluminum layer 42 was formed on the base material 41 by the electric aluminum plating method. Next, an approximately 7 μm-thick alumite layer 43 was formed by the anodic oxidation method so as to cover the entire surface of the electroplated aluminum layer 42, and, furthermore, the alumite layer 43 was blackened by infiltrating a blackish pigment. The arithmetic mean roughness Ra of the alumite layer 43 was 1.96 μm.

Next, the heat radiating component 10B was manufactured by the manufacturing method according to Modified Example 2 of the first embodiment. Specifically, firstly, a base material 41 made of copper (Cu) was prepared, and an approximately 20 μm-thick electroplated aluminum layer 42 was formed on the base material 41 by the electric aluminum plating method. Next, after a planarization treatment was carried out on the surface of the electroplated aluminum layer 42, an approximately 7 μm-thick alumite layer 43 was formed by the anodic oxidation method so as to cover the entire surface of the electroplated aluminum layer 42, and, furthermore, the alumite layer 43 was blackened by infiltrating a blackish pigment. The arithmetic mean roughness Ra of the alumite layer 43 was 0.48 μm.

Next, as the comparative examples, a sample having only the base material 41 made of copper (Cu) (heat radiating component X), a sample having only an approximately 20 μm-thick electroplated aluminum layer 42 formed on the base material 41 made of copper (Cu) (heat radiating component Y), and a sample having an approximately 20 μm-thick blackish plated layer (a plate made of an alloy of Ni and Sn, or the like) formed on the base material 41 made of copper (Cu) (heat radiating component z) were manufactured.

Figure 5:
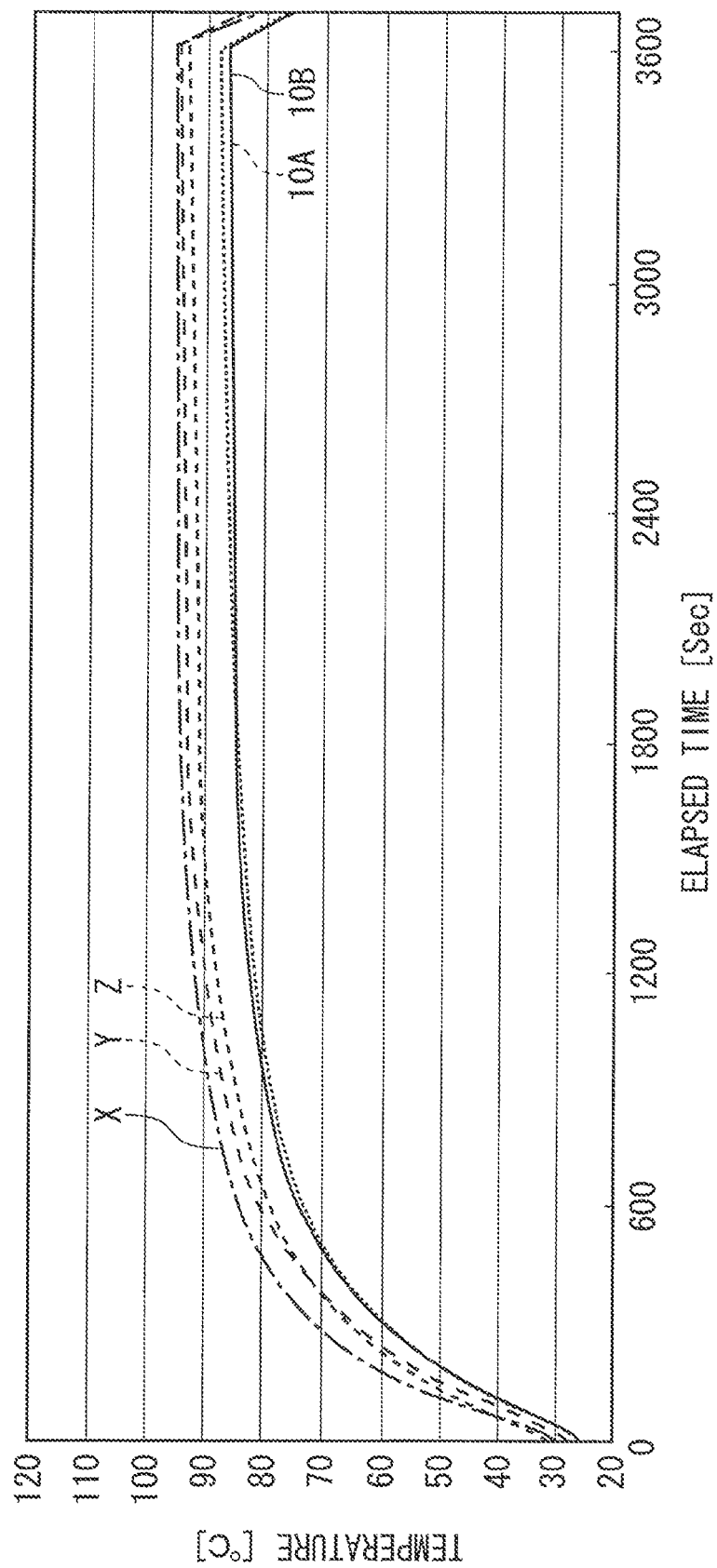
FIG. 5 is a view exemplifying the evaluation results of heat radiating properties.

After manufacturing the samples, a heater, a thermometer, and the samples (the heat radiating component 10A, the heat radiating component 10B, the heat radiating component X, the heat radiation component Y, and the heat radiation component Z were sequentially mounted) were attached to a predetermined block, and the temperature on the thermometer was measured when a certain voltage was applied to the heater for 3600 seconds (60 minutes). The results are shown in FIG. 5 and Table 1. FIG. 5 and Table 1 show that the samples show better heat radiating properties as the temperatures in 60 minutes starts to decrease.

TABLE 1

| Sample | Description | Temperature in 60 minutes (° C.) | Temperature gap from the criterion (° C.) |
|---|---|---|---|
| Heat radiating component X | Comparative example (copper only) . . . criterion | 95.7 | — |
| Heat radiating component Y | Comparative example (electric Al plated layer only) | 95.2 | −0.5 |
| Heat radiating component Z | Comparative example (blackish plate) | 93.7 | −2.0 |
| Heat radiating component 10A | First embodiment | 88.3 | −7.4 |
| Heat radiating component 10B | Modified example 2 of the first embodiment | 86.5 | −9.2 |

As shown in FIG. 5 and Table 1, the temperatures after 60 minutes of the heat radiating component X, the heat radiating component Y, and the heat radiating component Z, which were the comparative examples, were 95.7° C., 95.2° C., and 93.7° C. respectively. In addition, compared with the heat radiating component X, the temperatures after 60 minutes of the heat radiating component Y and the heat radiating component Z were lower by 0.5° C. and 2.0° C. respectively.

In contrast to the above, for the heat radiating component 10A manufactured by the manufacturing method according to the first embodiment, the temperature after 60 minutes was 88.3° C. In addition, compared with the heat radiating component X, the temperature after 60 minutes of the heat radiating component 10A was lower by 7.4° C. As such, it was confirmed that the heat radiating properties were significantly improved in the heat radiating component 10A manufactured by the manufacturing method according to the first embodiment compared with the heat radiating component X, the heat radiating component Y, and the heat radiating component Z, which were the comparative examples. That is, it was confirmed that, when the electroplated aluminum layer 42 is formed on the base material 41 made of copper (Cu), then, the alumite layer 43 is formed so as to cover the surface of the electroplated aluminum layer 42, and, furthermore, the alumite layer 43 is blackened, excellent heat radiating properties can be realized compared with the related art examples (the heat radiating component X, the heat radiating component Y, and the heat radiating component Z).

In addition, for the heat radiating component 10B manufactured by the manufacturing method according to Modified Example 2 of the first embodiment, the temperature after 60 minutes was 86.5° C. In addition, compared with the heat radiating component X, the temperature after 60 minutes of the heat radiating component 10B was lower by 9.2° C. This shows that the temperature after 60 minutes of the heat radiating component 10B was lower by 1.8° C. even compared with the heat radiating component 10A, which confirmed that the heat radiating properties were further improved (approximately 2% improved) in the heat radiating component 10B manufactured by the manufacturing method according to Modified Example 2 of the first embodiment compared with the heat radiating component 10A manufactured by the manufacturing method according to the first embodiment. That is, it was confirmed that, when the electroplated aluminum layer 42 is formed on the base material 41 made of copper (Cu), then, a planarization treatment is carried out on the surface of the electroplated aluminum layer 42, the alumite layer 43 is formed so as to cover the surface of the electroplated aluminum layer 42 for which the planarization treatment is carried out, and, furthermore, the alumite layer 43 is blackened, it is possible to further improve the heat radiating properties compared with a case in which the planarization treatment is not carried out.

Thus far, the preferred embodiment and the modified examples have been described in detail, but the invention is not limited to the above embodiment and the modified examples, and a variety of modifications and substitutions can be added to the above embodiment and the modified examples within the scope of the claims.

For example, the same modification as in Modified Example 2 of the first embodiment may be additionally applied to Modified Example 1 of the first embodiment. In addition, the heat radiating component may have a planar sheet shape.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A heat radiating component, comprising:
   a base material made mainly of copper;
   an electroplated aluminum layer that covers at least a part of a surface of the base material; and
   an alumite layer formed on the electroplated aluminum layer and formed by anodic-oxidizing the electroplated aluminum layer, wherein the electroplated aluminum layer covers an entirety of the base material, and the alumite layer covers an entirety of the electroplated aluminum layer, and wherein the surface roughness of the electroplated aluminum layer is less than or equal to 1 μm.

2. The heat radiating component according to claim 1, wherein the alumite layer is a blackish alumite layer.

3. A semiconductor package, comprising:
a substrate;
a semiconductor device mounted on the substrate; and
the heat radiating component of claim 1, which is disposed on the semiconductor device, and the heat radiating component is mounted on the substrate.

4. The heat radiating component according to claim 1, wherein the surface of the electroplated aluminum layer is subjected to planarization treatment, and the planarization treatment is blasting treatment.

5. The heat radiating component according to claim 1, wherein the alumite layer is formed of aluminum oxide.

6. The heat radiating component according to claim 1, wherein the electroplated aluminum layer is formed directly on the base material, and the alumite layer is formed directly on the electroplated aluminum layer.

7. The heat radiating component according to claim 1, wherein, among the electroplated aluminum layer and the alumite layer, only the alumite layer has a blackish pigment infiltrated therein.

8. The heat radiating component according to claim 7, wherein the alumite layer with the blackish pigment infiltrated therein has an emissivity of 0.90 to 0.95.

9. The heat radiating component according to claim 3, wherein the blackish alumite layer includes a blackish pigment infiltrated in a porous aluminum oxide.

10. The heat radiating component according to claim 9, wherein the blackish alumite layer has an emissivity of 0.90 to 0.95.

11. The heat radiating component according to claim 2, wherein the blackish alumite layer has an emissivity of 0.90 to 0.95.

12. The semiconductor package according to claim 3, wherein the substrate is formed of a different material than the heat radiating component.

13. The semiconductor package according to claim 3, wherein the substrate is a copper-clad laminate having an epoxy resin impregnated in a frame-retardant glass fabric base material.

* * * * *